United States Patent [19]
Takayama et al.

[11] Patent Number: 5,866,238
[45] Date of Patent: Feb. 2, 1999

[54] FERROELECTRIC THIN FILM DEVICE AND ITS PROCESS

[75] Inventors: Ryoichi Takayama; Yoshihiro Tomita; Satoru Fujii, all of Osaka; Masayuki Okano, Hyogo; Hideo Torii, Osaka; Eiji Fujii, Kyoto; Atsushi Tomozawa, Osaka, all of Japan

[73] Assignee: Minolta Co., Ltd., Osaka, Japan

[21] Appl. No.: 811,301

[22] Filed: Mar. 4, 1997

Related U.S. Application Data

[63] Continuation-in-part of Ser. No. 557,543, Nov. 14, 1995, abandoned, which is a continuation of Ser. No. 238,744, May 5, 1994, abandoned.

[51] Int. Cl.$^6$ ........................................................ B32B 3/00
[52] U.S. Cl. ......................... 428/209; 428/210; 428/701; 428/702
[58] Field of Search .................................. 428/209, 210, 428/688, 689, 701, 702

[56] References Cited

U.S. PATENT DOCUMENTS

| | | |
|---|---|---|
| 4,803,392 | 2/1989 | Kushida et al. . |
| 5,155,658 | 10/1992 | Inam et al. . |
| 5,225,031 | 7/1993 | McKee et al. . |
| 5,323,023 | 6/1994 | Fork . |
| 5,403,673 | 4/1995 | Haga et al. . |

FOREIGN PATENT DOCUMENTS

| | | |
|---|---|---|
| 3-3280 | 1/1991 | Japan . |
| 4-47606 | 2/1992 | Japan . |
| 4-279069 | 10/1992 | Japan . |

OTHER PUBLICATIONS

Doss, "Engineers Guide to High–Temperature Superconductivity", Wiley and Sons, 1989, p. 267.

*Primary Examiner*—Elizabeth Evans
*Attorney, Agent, or Firm*—McDermott Will & Emery

[57] ABSTRACT

A first ferroelectric thin film device is provided with a first substrate consisting of polycrystal, amorphous material or metal material and a first ferroelectric thin film formed on the first substrate. The average of thermal expansion coefficients of the substrate from room temperature to temperature for forming the ferroelectric thin film is $70 \times 10^{-7}/°C$. or more. At least 75% of crystal axes of the first ferroelectric thin film are oriented in <001>-direction. A second ferroelectric thin film device is provided with a second substrate consisting of amorphous material and a second ferroelectric thin film formed on the second substrate. The average of thermal expansion coefficients of the substrate from room temperature to temperature for forming the ferroelectric thin film is $50 \times 10^{-7}/°C$. or less. At least 75% of crystal axes of the second ferroelectric thin film are oriented in <100>-direction.

28 Claims, 5 Drawing Sheets

FERROELECTRIC THIN FILM DEVICE AND ITS PROCESS

This is a continuation-in-part application of Ser. No. 08/557,543 filed on Nov. 14, 1995, now abandoned, which is a continuation of Ser. No. 08/238,744 filed on May 5, 1994 abandoned.

BACKGROUND OF THE INVENTION

The present invention pertains to a ferroelectric thin film device that finds applications in pyroelectric infrared sensor devices, piezoelectric devices, electrooptical devices, and capacitors made of ferroelectric materials and to a fabricating process thereof.

Ferroelectrics are substances in which there exists spontaneous polarization by permanent dipoles arranged in a parallel or antiparallel fashion even when there are no electric fields. The direction of such spontaneous polarization is reversed by the application of an electric field from the outside. Materials having ferroelectricity find applications in various types of electronic components such as pyroelectric infrared sensor devices, piezoelectric devices, optical modulators based on electrooptical effects of the ferroelectric material, and non-volatile memory devices. Typical ferroelectric materials are compounds of oxygen having a perovskite-type crystal structure (e.g., $PbTiO_3$, $Pb_{1-x}La_xTi_{1-x/4}O_3$ (PLT), $PbZr_xTi_{1-x}O_3$ (PZT), and $BaTiO_3$.

There is an application of the ferroelectric in which changes in the spontaneous polarization $P_s$ are extracted as output. For example, in the case of pyroelectric infrared sensor device or in the case of piezoelectric devices, their output is maximized when the spontaneous polarization $P_s$ occurs in one direction only. There are many types of ferroelectrics and they have different properties (e.g., different permittivities and velocities of sound) depending on the crystal axis. Therefore, there have been demands for a technique capable of arranging crystal axes in the same direction, in order to improve the characteristics of the ferroelectric and realize new devices with sophisticated functions. Most of the ferroelectrics, currently used for the infrared sensors and piezoelectric devices, are polycrystalline ceramics which do not have any directionality in their crystal axis arrangement, as a result of which the spontaneous polarization $P_s$ occurs along several crystal axes.

As electronic components have been become smaller and smaller, ferroelectric devices likewise are reduced in size. The advancement of ferroelectric thin film technology has been expected. Particularly, ferroelectric thin film devices incorporating therein epitaxial thin layers or oriented thin layers are now under intensive research.

The crystal axis of ferroelectrics depends very much on the type of substrate. The following has been reported in several papers, for example, in J. Appln. Phys., Vol. 60, p.361 (1986). That is, the crystal axes of $PbTiO_3$ (or PZT) are oriented in the <001>-direction when a MgO single crystal substrate cleaved on the (100)-plane is used, while it orients in the <111>-direction when a sapphire single crystal substrate is used (i.e., the sapphire's c plane). Conventional ferroelectric thin film devices rely on expensive MgO or sapphire substrates. This increases the fabrication cost of ferroelectric thin film devices thereby increasing the production cost of electronic components employing ferroelectric thin film devices.

Direct epitaxial growth of ferroelectric thin films on the silicon substrate is infeasible, which is an obstacle to integration of high-performance signal processing devices into ferroelectric thin film devices.

Therefore, it is a main object of the present invention to provide an improved ferroelectric thin film device. According to the present ferroelectric thin film device not relying on expensive substrates, the crystal axis can be arranged. As a result, the present invention can not only cut down the production cost but also improve the device performance.

SUMMARY OF THE INVENTION

The details of how the present invention was made are explained.

When growing a thin film of $PbTi_3$, which is a perovskite-type oxide, on a MgO substrate by sputtering, it is essential to keep the substrate temperature at about 600° C. Such a substrate temperature is above the Curie point of $PbTiO_3$ (i.e., 490° C.). Therefore, as the substrate temperature drops from the film formation temperature down to room temperature, the $PbTiO_3$'s crystal structure undergoes a phase transition, that is, from cubic system to tetragonal system. This phenomenon may be explained by such an assumption that the substrate is compressive-stressed when the substrate temperature drops from the film formation temperature down to room temperature. In other words, one of the factors that cause $PbTiO_3$ to orient in the <001>-direction on the MgO single crystal cleaved on the (100)-plane is considered to be the MgO's great thermal expansion coefficient (i.e., up to $120 \times 10^{-7}$/°C.). In the cooling step, the <001>-axis of $PbTiO_3$ (thermal expansion coefficient: $-900 \times 10^7$/°C.) abruptly increases, whereas the <100>-axis (thermal expansion coefficient: $380 \times 10^{-7}$/°C.) decreases. Therefore, if the <001>-axis is perpendicularly arranged to the MgO substrate, the energy of strain falls off as the MgO substrate shrinks.

Based on the above-described knowledge, the inventors estimated that the crystal direction taken at phase transition time depended upon the magnitude of the average of substrate thermal expansion coefficients from room temperature to a temperature at film formation time (hereinafter referred to as the average thermal expansion coefficient, abbreviated ATEC). Various types of substrates having different ATECs were prepared, on which ferroelectric thin films were formed, and they were examined. The examination showed that there was a close relationship between the magnitude of the substrate ATEC and the orientation of the formed ferroelectric thin film.

The present invention discloses a first ferroelectric thin film device comprising a substrate composed of polycrystal, amorphous material or metal material and a ferroelectric thin film formed on the substrate, wherein the average of thermal expansion coefficients of the substrate from room temperature to a film formation temperature of the ferroelectric thin film is $70 \times 10^{-7}$/°C. or more, whereby at least 75% of crystal axes of the ferroelectric thin film are oriented in the <001>-direction.

The present invention discloses a second ferroelectric thin film device comprising a substrate composed of amorphous material and a ferroelectric thin film formed on the substrate, wherein the average of thermal expansion coefficients of the substrate from room temperature to a film formation temperature of the ferroelectric thin film is $50 \times 10^{-7}$/°C. or less, whereby at least 75% of crystal axes of the ferroelectric thin film are oriented in the <100>-direction.

Conventional ferroelectric thin films are formed on expensive MgO substrates. In contrast, neither the first ferroelectric thin film device nor the second ferroelectric thin film device relies on the MgO substrate. The present invention makes it possible to use less expensive substrate as compared with the MgO substrate and provide the same ferroelectric thin film as achieved by the MgO substrate. This results in cutting down the electronic component production cost. Further, the present invention enables direct growth of ferroelectric thin films on the Si substrate, thereby providing high-performance integrated signal processors.

Additionally, the inventors of the present invention discovered that the ferroelectric thin film formation improved if an intermediate layer with crystallinity was inserted between a substrate and a ferroelectric thin film.

When forming a ferroelectric epitaxial thin film (or a ferroelectric oriented thin film) on the surface of an intermediate layer, it is preferable that the misfit between a lattice constant of the intermediate layer and a lattice constant of the ferroelectric thin film at a film formation temperature of the ferroelectric thin film is within 15%. For the case of ferroelectrics such as lead titanate, lead zirconate titanate and barium titanate, the oxygen-to-oxygen distance (OOD) in the <001>-direction is around 4.0 A (angstrom). More specifically, for the case of $Pb(Zr_{1-x}Ti_x)O_3$ that is a ferroelectric thin film, the ODD in the <001>-direction is 3.90–4.15 A. Meanwhile, for the case of MgO, the ODD in the <100>-direction is 4.21 A. On the other hand, for the case of NiO of an NaCl structure, the ODD is 4.19 A, and for the case of CoO of an NaCl structure, the ODD is 4.26 A. As in the MgO substrate, the constant-to-constant misfit is acceptable.

The present invention discloses a third ferroelectric thin film device comprising a substrate composed of polycrystal, amorphous material or metal material, an intermediate layer with crystallinity formed on the substrate, and a ferroelectric thin film formed on the intermediate layer, wherein the average of thermal expansion coefficients of the substrate from room temperature to a film formation temperature of the ferroelectric thin film is $70 \times 10^{-7}/°C$. or more and the misfit between a lattice constant of the intermediate layer and a lattice constant of the ferroelectric thin film at the aforesaid film formation temperature is within 15%, whereby at least 75% of crystal axes of the ferroelectric thin film are oriented in the <001>-direction.

The present invention discloses a fourth ferroelectric thin film device comprising a substrate composed of amorphous material, an intermediate layer with crystallinity formed on the substrate, and a ferroelectric thin film formed on the intermediate layer, wherein the average of thermal expansion coefficients of the substrate from room temperature to a film formation temperature of the ferroelectric thin film is $50 \times 10^{-7}/°C$. or less and the misfit between a lattice constant of the intermediate layer and a lattice constant of the ferroelectric thin film at the aforesaid formation temperature is within 15%, whereby at least 75% of crystal axes of the ferroelectric thin film are oriented in the <100>-direction.

In accordance with the above-described third and fourth ferroelectric thin film devices, provided between the substrate and the ferroelectric thin film is the intermediate layer. Since the misfit between a lattice constant of the intermediate layer and that of the ferroelectric thin film is within 15%, this very much improves the ferroelectric thin film formation.

In each of the first to fourth ferroelectric thin film devices, it is preferable that the ferroelectric thin film is made of a material mainly including a ferroelectric material selected from the group consisting of lead titanate system, lead zirconate titanate system or a barium titanate system. As a result, at least 75% of crystal axes of the ferroelectric thin film formed are oriented in the <001>-direction in the case of substrates whose ATEC is $70 \times 10^{-7}/°C$. or more. On the other hand, in the case of substrates whose ATEC is $50 \times 10^{-7}/°C$. or less, at least 75% of crystal axes of the ferroelectric thin film formed are oriented in the <100>-direction.

In each of the first to fourth ferroelectric thin film devices, it is preferable that the ferroelectric thin film has a tetragonal-system crystal structure. As a result of such a crystal structure, the ferroelectric thin film orients strongly in the <001>-direction or in the <100>-direction.

Further, in each of the third to fourth ferroelectric thin film devices, it is preferable that the aforesaid intermediate layer is composed of an oxide having an NaCl crystal structure. As a result, the ferroelectric thin film formed on the intermediate layer is made to orient strongly in the <001>-direction or in the <100>-direction.

It is preferable that the aforesaid oxide is a (100)-oriented oxide. As a result of such arrangement, the intermediate layer's NaCl crystal structure orients also in the (001)-plane thereby making the ferroelectric thin film formed on the intermediate layer orient strongly in the <001>direction or in the <100>-direction.

It is preferable that the aforesaid oxide is either NiO, CoO, or MgO. This ensures that a (100)-oriented NaCl crystal structure is formed.

The present invention discloses a first method of fabricating a ferroelectric thin film device. The first method comprises a first step of forming on a substrate composed of polycrystal, amorphous material or metal material an intermediate layer composed of a (100)-oriented oxide having an NaCl crystal structure and a second step of forming on the intermediate layer a tetragonal-system, perovskite-type ferroelectric thin film. At the first step of the first method, the average of thermal expansion coefficients of the substrate from room temperature to a film formation temperature of the ferroelectric thin film is $70 \times 10^{-7}/°C$. or more, and the second step further includes a step of orienting at least 75% of crystal axes of the ferroelectric thin film in the <001>-direction.

The present invention discloses a second method of fabricating a ferroelectric thin film device. The second method comprises a first step of forming on a substrate composed of amorphous material an intermediate layer composed of a (100)-oriented oxide having an NaCl crystal structure and a second step of forming on the intermediate layer a tetragonal-system, perovskite-type ferroelectric thin film. At the first step of the second method, the average of thermal expansion coefficients of the substrate from room temperature to a film formation temperature of the ferroelectric thin film is $50 \times 10^{-7}/°C$. or less, and the second step further includes a step of orienting at least 75% of crystal axes of the ferroelectric thin film strongly in the <100>-direction.

In the first or second ferroelectric thin film fabricating method, both the first step and the second step may be carried out by means of a sputtering technique; the first step is carried out by means of a MOCVD technique using organometallic complex vapors as a source gas and the second step is carried out by means of a sputtering technique; the first step is carried out by means of a sputtering technique and the second step is carried out by means of a MOCVD technique using organometallic complex vapors as a source gas; or both the first step and the second step are carried out by means of a MOCVD technique using organometallic complex vapors as a source gas.

If the intermediate layer is formed by means of a plasma excitation MOCVD technique using an organometallic complex such as metal acetylacetonato as a source gas, this permits various oxides, which have an NaCl crystal structure with its <100>-axis perpendicular to the substrate, to be deposited. For example, if a source gas is nickel acetylacetonato, this permits an NiO thin film whose crystal axes orient in the <100>-direction to be deposited on the substrate. For the case of cobalt acetylacetonato, this permits a CoO thin film whose crystal axes orient in the <100>-direction to be deposited on the substrate. For magnesium acetylacetonato, this permits an MgO thin film whose crystal axes orient in the <100>-direction to be deposited on the substrate.

DETAILED DESCRIPTION OF THE INVENTION
FIRST EMBODIMENT

A first ferroelectric thin film device according to the first embodiment comprises a substrate composed of polycrystal, amorphous material or metal material and a ferroelectric thin film formed on the substrate. Since the average of thermal expansion coefficients of the substrate from room temperature to a film formation temperature of the ferroelectric thin film is $70 \times 10^{-7}/°C$. or more, at least 75% of crystal axes of the ferroelectric thin film are oriented in the <001>-direction.

A second ferroelectric thin film device according the first embodiment comprises a substrate composed of amorphous material and a ferroelectric thin film formed on the substrate. Since the average of thermal expansion coefficients of the substrate from room temperature to a film formation temperature of the ferroelectric thin film is $50 \times 10^{-7}/°C$. or less, at least 75% of crystal axes of the ferroelectric thin film are oriented in the <100>-direction.

In the first or second ferroelectric thin film device according to the first embodiment, it is preferable that the ferroelectric thin film is composed of a material mainly including ferroelectric material selected from the group consisting of lead titanate system, lead zirconate titanate system or barium titanate system. In this case, the ferroelectric thin film formed has a structure of tetragonal system.

The first embodiment of the present invention is described more fully by making reference to the accompanying drawings.

In the first place, five different substrates composed of different substrate materials were prepared (dimensions: 20 mm×20 mm; thickness: 1 mm), namely a quartz glass substrate (amorphous material: average thermal expansion coefficient (ATEC): $5 \times 10^{-7}/°C$.); a silicon substrate cleaved on the (100)-plane (single crystal material: ATEC: $25 \times 10^{-7}/°C$.); a glass substrate made of Corning 7059 (amorphous material: ATEC: $46 \times 10^{-7}/°C$.); a MgO ceramic substrate (polycrystal material: ATEC: $120 \times 10^{7}/°C$.); and a metal substrate of stainless (metal material: ATEC: $180 \times 10^{-7}/°C$.). Each ATEC is the average of substrate thermal expansion coefficients from room temperature to a ferroelectric thin film formation temperature.

In the second place, a 0.2 mm-thick stencil mask was used in order to pattern-form a ferroelectric thin film composed of $Pb_xLa_{1-x}Ti_{1-x/4}O_3$ ($0 \leq x \leq 0.25$) on each substrate (A) to (E) by means of a high-frequency magnetron technique. Such a target was prepared as follows. First, a blend of powders of PbO, $La_2O_3$, and $TiO_2$ was subjected to a calcination treatment at a temperature of 750° C. for four hours, was crushed and pulverized, and was mixed with PbO powder of 20 mol % to avoid lack of Pb. Parameters for film formation by sputtering were as follows: substrate temperature: 600° C.; sputter gas: a mixture with a ratio of 9:1 of $Ar:O_2$; gas pressure: 0.5 Pa; and high-frequency installed power: 90 W (13.56 MHz). The film thickness of the ferroelectric thin films formed was about 1 μm.

Figure 1:
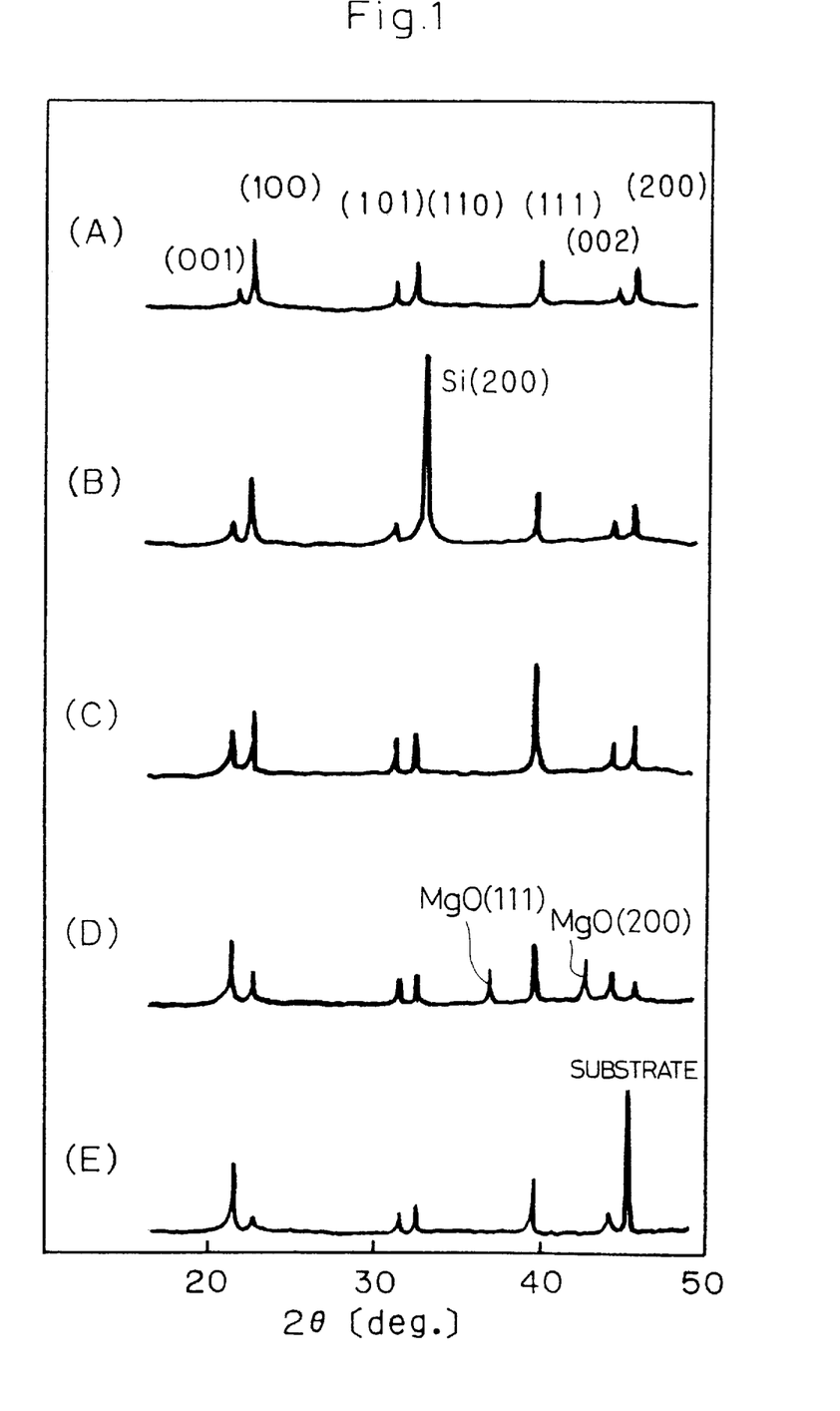
FIG. 1 shows X-ray diffraction patterns of ferroelectric thin films formed on substrates composed of different substrate materials.

FIG. 1 shows X-ray diffraction patterns (A)–(E) of the ferroelectric thin films formed on the above-described substrates. Although each of these samples formed on the substrates has a perovskite-type polycrystal structure, it is found that (001)- and (100)-reflection have a relatively great intensity. Further, it is found that ATEC is closely related to the orientation of the crystal structure. In other words, the intensity of the (001)-reflection proved to become greater than the intensity of the (100)-reflection as ATEC increased. In contrast, the intensity of the (100)-reflection proved to become greater than the intensity of the (001)-reflection as the ATEC decreased. The samples respectively relating to the diffraction patterns (C), (D), (E) were examined. From a comparison of (C) with (D), it was proved that at least 75% of its crystal axes were oriented in the (001)-direction if ATEC was $70 \times 10^{-7}/°C$. or more and it was further proved that almost all the crystal axes were oriented in the (001)-direction if ATEC was $90 \times 10^{-7}/°C$. or more. Additionally, it was found from the result of the sample observation that at lest 75% of its crystal axes were oriented in the (100)-direction if ATEC was $50 \times 10^{-7}/°C$. or less.

In the present embodiment, $Pb_xLa_{1-x}Ti_{1-x/4}O_3$ is used to form a ferroelectric thin film. Other materials such as lead titanate system, lead zirconate titanate system and barium titanate system may be useful and the same result that $Pb_xLa_{1-x}Ti_{1-x/4}O_3$ produces can be expected.

SECOND EMBODIMENT

A first ferroelectric thin film device according the second embodiment is provided with a substrate composed of polycrystal, amorphous material or metal material, an intermediate layer with crystallinity formed on the substrate and a ferroelectric thin film formed on the intermediate layer. Since the average of thermal expansion coefficients of the substrate from room temperature to a film formation temperature of the ferroelectric thin film is $70 \times 10^{17}/°C$. or more and the misfit between a lattice constant of the intermediate layer and a lattice constant of the ferroelectric thin film at the film formation temperature is within 15%, at least 75% of crystal axes of the ferroelectric thin film are oriented in the <001>-direction.

A second ferroelectric thin film device according the second embodiment is provided with a substrate composed of amorphous material, an intermediate layer with crystallinity formed on the substrate and a ferroelectric thin film formed on the intermediate layer. Since the average of thermal expansion coefficients of the substrate from room temperature to a film formation temperature of the ferroelectric thin film is $50 \times 10^{17}/°C$. or less and the misfit between the lattice constant of the intermediate layer and the lattice constant of the ferroelectric thin film at the film formation temperature is within 15%, at least 75% of crystal axes of the ferroelectric thin film are oriented in the <100>-direction.

In the first or second ferroelectric thin film device according to the second embodiment, it is preferable that the ferroelectric thin film is composed of a material mainly composed of either lead titanate system, lead zirconate titanate system or barium titanate system. Also, it is preferable that the intermediate layer is composed of a (100)-oriented oxide having an NaCl crystal structure. In this case, the ferroelectric thin film formed has a structure of tetragonal system.

The second embodiment of the present invention is described more fully by making reference to the accompanying drawings.

Figure 2:
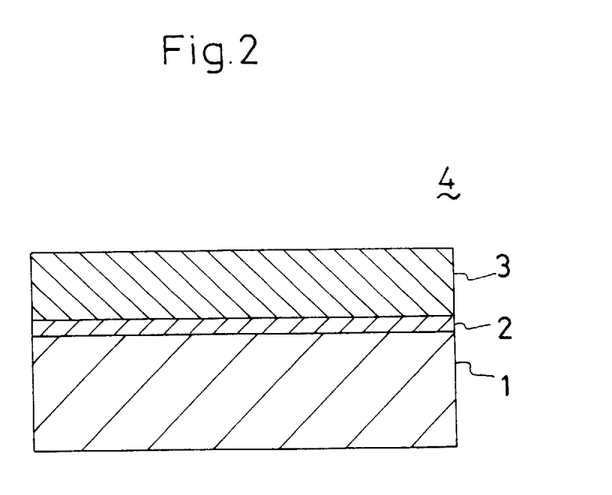
FIG. 2 shows in cross section the film structure of a ferroelectric thin film device according to a second embodiment of the present invention.

FIG. 2 shows the organization of a ferroelectric thin film device according to the second embodiment of the present invention.

FIG. 2 shows a ferroelectric thin film device 4. A substrate 1 is composed of the same material as that of the first embodiment. Formed on the substrate 1 is an intermediate layer 2. The intermediate layer 2 is formed of MgO having an NaCl crystal structure which crystal-orients along the <100>axis. A ferroelectric thin film 3, composed of $Pb_xLa_{1-x}Ti_{1-x/4}O_3$ ($0 \leq x \leq 0.25$), is formed by means of a sputtering technique on the intermediate layer 2.

A method of fabricating the ferroelectric thin film device 4 is described.

Figure 3:
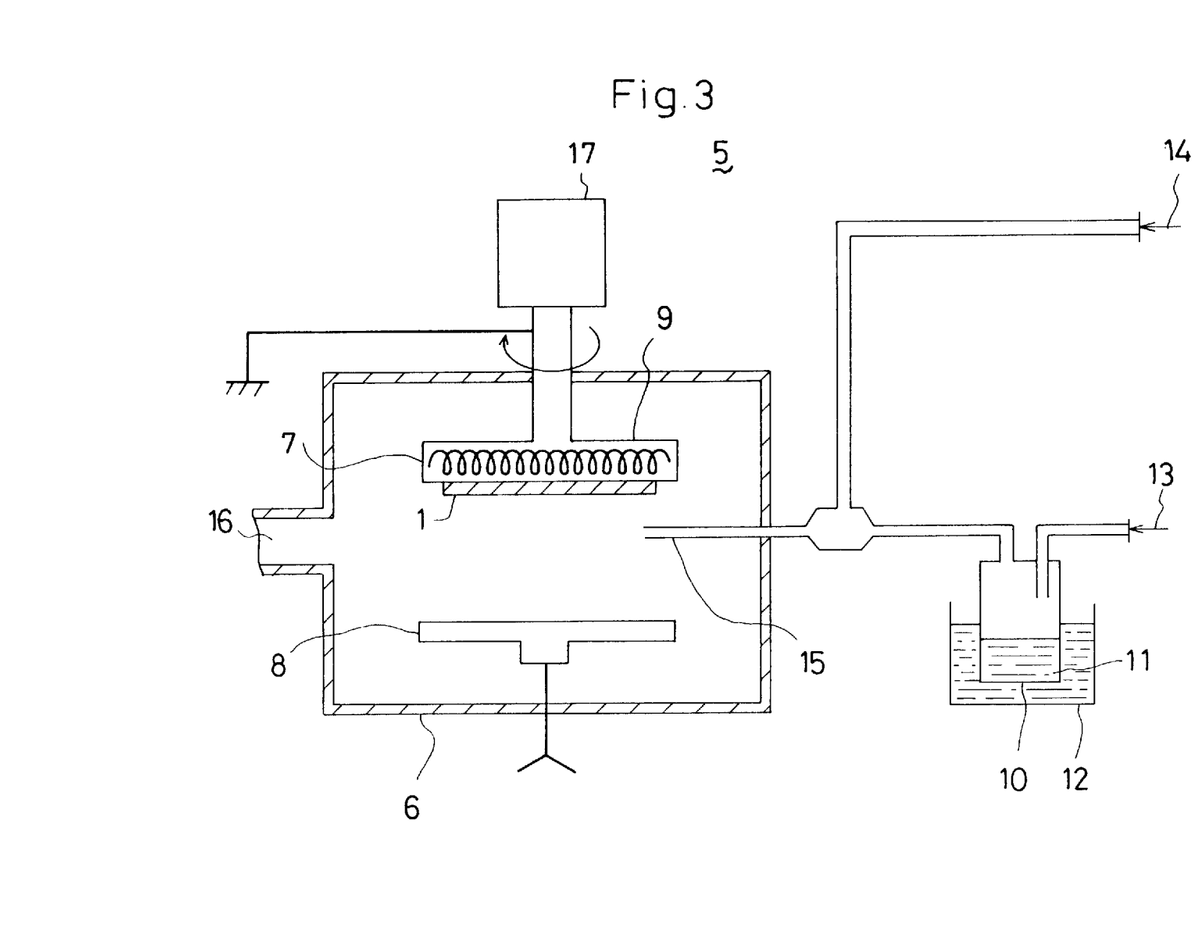
FIG. 3 shows in cross section a plasma excitation MOCVD apparatus used for fabricating a ferroelectric thin film device according to the second embodiment or a third embodiment of the present invention.

The intermediate layer 2 composed of MgO having an NaCl crystal structure which crystal-orients along the <100>-axis is formed on each of the various substrates as in the first embodiment by means of a plasma excitation MOCVD apparatus 5 of FIG. 3.

In the MOCVD apparatus 5, a plasma is generated by high-frequency between electrodes arranged in parallel in a vacuum chamber 6, that is, an electrode 7 on the ground side and an electrode 8 on the RF side. An organometallic source gas introduced is decomposed by such a generated plasma, and the decomposed gas is chemically vapor-deposited on the substrate 1 in the form of a thin film. The substrate 1, held at one surface thereof in adhered state by the ground-side electrode 7, is preheated by a substrate heater 9 up to a temperature of 400° C.

A magnesium acetylacetonato 11 is fed into a material vaporization container 10. The magnesium acetylacetonato 11 is heated by means of an oil bath 12 the temperature of which is kept at 190° C. Vapors of the magnesium acetylacetonato 11 is forced into a vacuum chamber 6 with the aid of a carrier gas (nitrogen) 13 that flows at a flow rate of 30 ml/min.

An oxygen gas 14 (i.e., a reaction gas) is made to flow at a flow rate of 2 ml/min and is mixed with the carrier gas 13 on the way to the vacuum chamber 6, the mixed gas entering the vacuum chamber 6 through a blow-off nozzle 15. The vacuum chamber 6 is exhausted from an outlet 16 and evacuated to a vacuum state of 7.90 Pa. Then, a high-frequency power of 400 W is applied to the RF-side electrode 8 at a frequency of 13.56 MHz for 10 minutes, whereby a plasma is generated between the ground-side electrode 7 and the RF-side electrode 8. As a result, the intermediate layer 2 of MgO that crystal-orients in the <100>-direction is deposited 200 nm on the other surface of the substrate 1. During such a film formation process, the substrate 1 is rotated by a substrate rotating motor 17 at a speed of 120 rpm.

Next, as in the first embodiment, the ferroelectric thin film 3 of $Pb_xLa_{1-x}Ti_{1-x/4}O_3$ ($0 \leq x \leq 0.25$) having a film thickness of about 1 μm is formed by a high-frequency magnetron sputtering technique on the intermediate layer 2.

Figure 4:
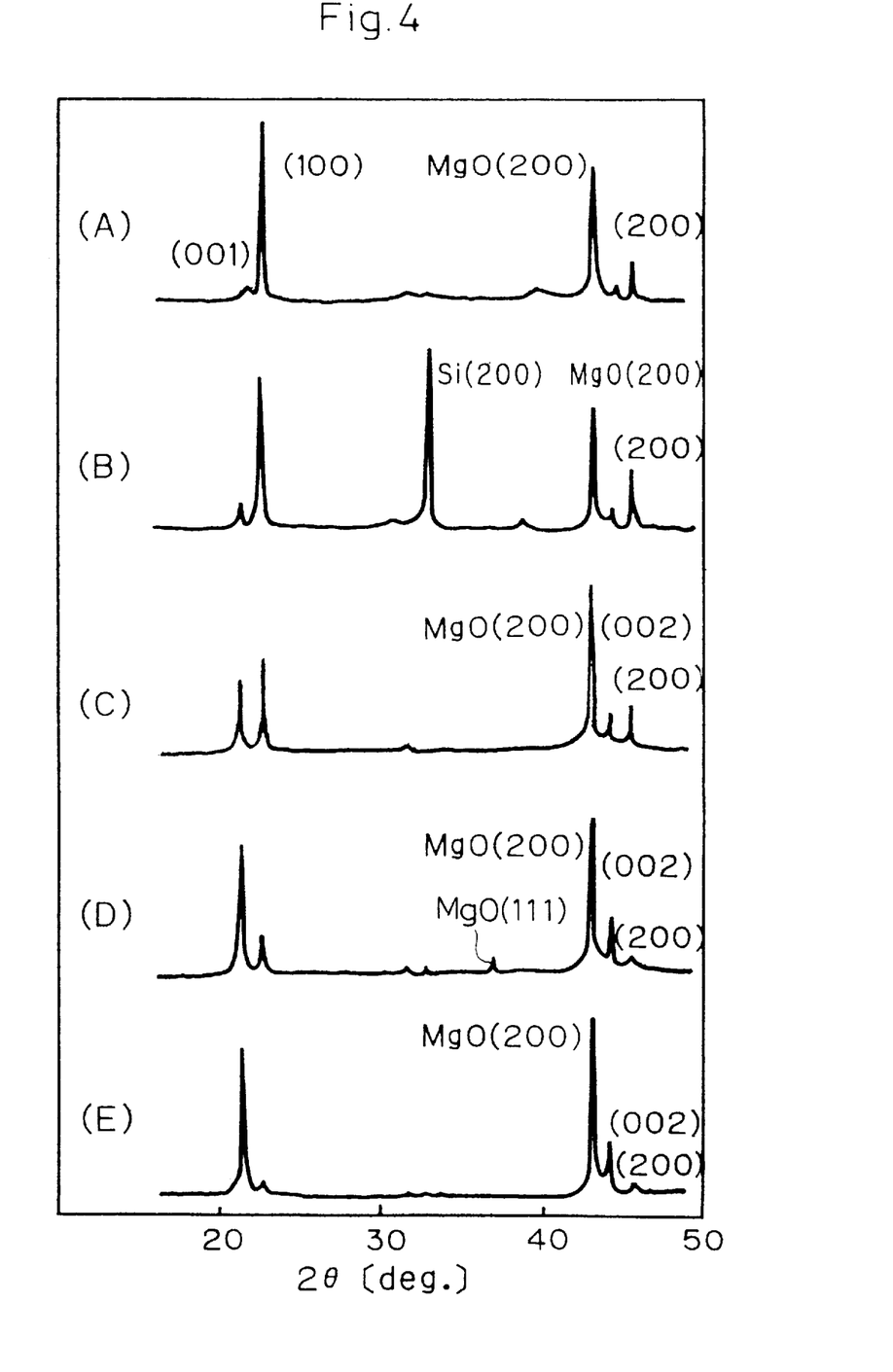
FIG. 4 shows X-ray diffraction patterns of ferroelectric thin films according to the second embodiment of the present invention.

FIG. 4 shows X-ray diffraction patterns of different ferroelectric thin films formed on different substrates (i.e., a quartz glass substrate (amorphous material), a silicon substrate (single crystal material), a Corning 7059 glass substrate (amorphous material), a MgO ceramic substrate (polycrystal material), and a stainless substrate (metal material)). Only (001)- and (100)-reflections of the perovskite-type crystal structure and their higher reflections were observed in the ferroelectric thin film device in the second embodiment. As to the relationship between the substrate's ATEC and the crystal orientation, the followings can be understood from FIG. 4. Namely, (1) the intensity of the (001)-reflection becomes greater than the intensity of the (100)-reflection as the substrate's ATEC increases, while the intensity of the (100)-reflection becomes greater than the intensity of the (001)-reflection as the substrate's ATEC decreases; (2) according to the observation of samples (C) to (E), especially according to comparison of samples (C) with (D), at lest 75% of its crystal axes are oriented in the (001)-direction when the substrate's ATEC becomes $70 \times 10^{-7}$ or more; and (3) according to the observation of samples (A) to (C), at least 75% of its crystal axes are oriented in the (100)-direction when the substrate's ATEC becomes $50 \times 10^{-7}$ or less.

If, instead of using magnesium acetylacetonato, cobalt acetylacetonato or nickel acetylacetonato is used as a source gas so as to form the intermediate layer 2 of an NaCl oxide by a plasma excitation MOCVD technique, this permits a (100)-oriented CoO or NiO film to grow on various types of substrates. Suppose a ferroelectric thin film of $Pb_xLa_{1-x}Ti_{1-x/4}O_3$ is formed on such an intermediate layer 2. In the case of using a substrate having a great ATEC, the result is a <001>orientated film. On the other hand, in the case of using a substrate having a low ATEC, the result is a <100>-oriented film.

In the present embodiment, $Pb_xLa_{1-x}Ti_{1-x/4}O_3$ is used as ferroelectric thin film material. Other materials such as $PbTiO_3$, PZT, and $BaTiO_3$ may be useful and the same result that $Pb_xLa_{1-x}Ti_{1-x/4}O_3$ produces can be expected.

THIRD EMBODIMENT

Though a ferroelectric thin film device 4 according to the third embodiment is basically the same in construction as the ferroelectric thin film according to the second embodiment, the third embodiment is different therefrom in method of forming the intermediate layer 2. In detail, the intermediate layer 2 made of oxide of MgO thin film having an NaCl crystal structure with its <100>-axes is formed on each substrate composed of the same materials as that of the first embodiment, then the ferroelectric thin film 3 composed of $PbTiO_3$ is formed on the intermediate layer 2 by a plasma excitation MOCVD technique.

A way of fabricating the ferroelectric thin film device 4 is now described below.

As in the second embodiment, the intermediate layer 2 made of oxide of MgO thin film having an NaCl crystal structure with its <100>-axes is formed on the substrate 1. Thereafter, the ferroelectric thin film 3 of $PbTiO_3$ is formed on the intermediate layer 2 using a plasma excitation MOCVD apparatus 21 of FIG. 5.

Figure 5:
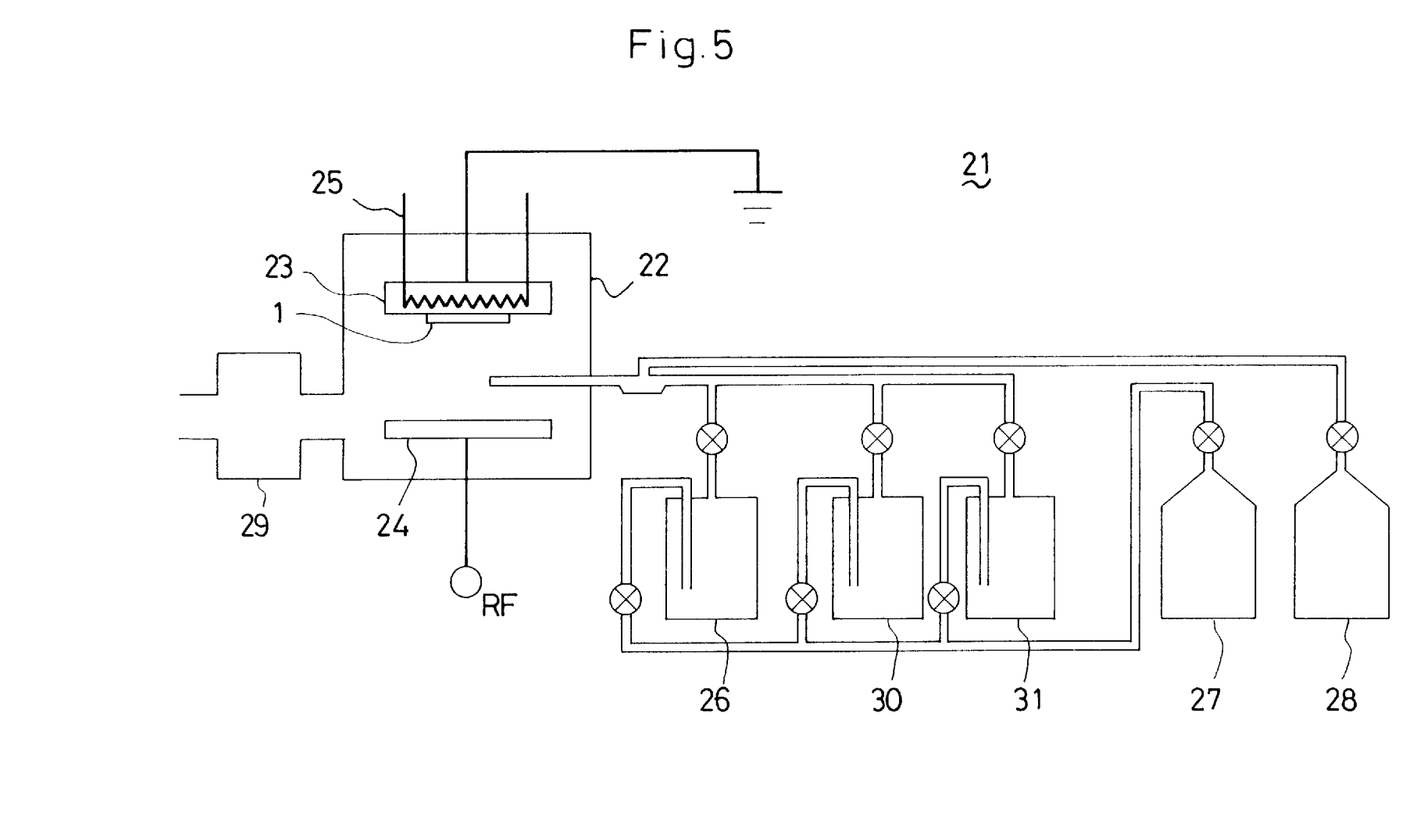
FIG. 5 shows in cross section another plasma excitation MOCVD apparatus used for fabricating a ferroelectric thin film device according to the second or third embodiment of the present invention.

In the MOCVD apparatus 21, a plasma is generated by high-frequency between an electrode 23 provided on the ground side and an electrode 24 provided on the RF side which are arranged in parallel with each other in a vacuum chamber 6. An organometallic source gas introduced is decomposed by such a generated plasma, and the decomposed source gas is chemically vapor-deposited on the substrate 1 in the form of a thin film. The substrate 1 is held at one surface thereof in adhered state by the ground-side electrode 23 and is preheated by a substrate heater 25 up to a temperature of 400° C.

Magnesium acetylacetonato is fed into a first material vaporization container 26. The temperature of this magnesium acetylacetonato is kept at a temperature of 190° C. Vapors of the magnesium acetylacetonato is forced into a vacuum chamber 22 by a carrier gas (nitrogen) 27 that flows at a flow rate of 30 ml/min. An oxygen gas 28, as a reaction gas, is made to flow at a flow rate of 2 ml/min and, on the way to the vacuum chamber 22, is mixed with the carrier gas 27, thereafter the mixed gas entering the vacuum chamber 22 through a blow-off nozzle. At this point in time, the vacuum chamber 22 is exhausted by a vacuum exhaust system 29 and is excavated to a vacuum state of 7.90 Pa. Then, a high-frequency power of 400 W is applied to the RF-side electrode 24 at a frequency of 13.56 MHz for 10 minutes, whereby a plasma is generated between the ground-side electrode 23 and the RF-side electrode 24. As a result, the intermediate layer 2, which is a <100>-oriented MgO thin film, is deposited 200 nm on the other surface of the substrate 1.

Next, the ferroelectric thin film 3 of $PbTiO_3$ is formed on the intermediate layer 2. In other words, after the substrate heater 25 heats up to between 400° C. and 500° C., $Pb(C_{11}H_{19}O_2)$ is discharged into a second material vaporization container 30, the temperature of the $Pb(C_{11}H_{19}O_2)$ being kept at a temperature of 130° C. for vaporization. Next, $Ti(i-C_3H_7O)_4$ is discharged into a third material vaporization container 31, the temperature of the $Ti(i-C_3H_7O)_4$ being kept at a temperature of 50° C. for vaporization. Both vapors of the $Pb(C_{11}H_{19}O_2)$ and vapors of $Ti(i-C_3H_7O)_4$ are forced to flow into the vacuum chamber 22 by the carrier gas 27 that flows at a flow rate of 10 ml/min. The oxygen gas 28, serving as a reaction gas, is made to flow at a flow rate of 40 ml/min and, on the way to the vacuum chamber 22, is mixed with the carrier gas 27, the mixed gas entering the vacuum chamber 22 from the blow-off nozzle. At this point in time, the vacuum chamber 22 is exhausted by the vacuum exhaust system 29 and is excavated to a vacuum state of 3.90 Pa. Then, a high-frequency power of 400 W is applied to the RF-side electrode 24 for 20 minutes, whereby a plasma is generated between the ground-side electrode 23 and the RF-side electrode 24. This permits $PbTiO_3$ to grow 1 μm on the intermediate layer 2 which is a <100>-oriented MgO thin film formed on the substrate 1.

The present embodiment and the second embodiment have the same result with regard to diffraction pattern. That is, only (001)- and (100)-reflections of the perovskite-type crystal structure and their higher reflections were observed. Also, the followings can be understood as to the relationship between the substrate's ATEC and the crystal orientation. Namely, (1) the intensity of the (001)-reflection becomes greater than the intensity of (100)-reflection as the substrate's ATEC increases, while the intensity of the (100)-reflection becomes greater than the intensity of (001)-reflection as the substrate's ATEC decreases; (2) at least 75% of its crystal axes are oriented in the (001)-direction when the substrate's ATEC becomes $70 \times 10^{-7}/°C$. or more; and (3) at least 75% of its crystal axes are oriented in the (100)-direction when the substrate's ATEC becomes $50 \times 10^{-7}/°C$. or less. In the present embodiment, the speed of forming the ferroelectric thin film 3 triples compared with the second embodiment.

Even in cases where the intermediate layer 2 (i.e., a (100)-oriented oxide thin film having an NaCl crystal structure), is formed by sputtering on the substrate 1 and a tetragonal-system, perovskite-type ferroelectric thin film is formed by sputtering on the intermediate layer 2, it is possible to selectively form a <001>-oriented ferroelectric thin film or a <100>-oriented ferroelectric thin film according to the substrate's 1 ATEC. However, the crystallinity was found to tend to depend on the substrate type.

The invention claimed is:

1. A ferroelectric thin film device comprising a substrate consisting of polycrystal, amorphous material or metal material and a ferroelectric thin film formed on said substrate, wherein:

(a) the average of thermal expansion coefficients of said substrate from room temperature to a film formation temperature of said ferroelectric thin film is $70 \times 10^{-7}/°C$. or more, and (b) at least 75% of crystal axes of said ferroelectric thin film are oriented in the <001>-direction.

2. A ferroelectric thin film device as in claim 1, wherein said ferroelectric thin film mainly includes a ferroelectric material selected from the group consisting of lead titanate system, lead zirconate titanate system or barium titanate system.

3. A ferroelectric thin film device as in claim 1, wherein said ferroelectric thin film has a tetragonal-system crystal structure.

4. A ferroelectric thin film device comprising a substrate consisting of amorphous material and a ferroelectric thin film formed on said substrate, wherein:

(a) the average of thermal expansion coefficients of said substrate from room temperature to a film formation temperature of said ferroelectric thin film is $50 \times 10^{-7}/°C$. or less, and (b) at least 75% of crystal axes of said ferroelectric thin film are oriented in the <100>-direction.

5. A ferroelectric thin film device as in claim 4, wherein said ferroelectric thin film mainly includes a ferroelectric material selected from the group consisting of lead titanate system, lead zirconate titanate system or barium titanate system.

6. A ferroelectric thin film device as in claim 4, wherein said ferroelectric thin film has a tetragonal-system crystal structure.

7. A ferroelectric thin film device comprising a substrate consisting of polycrystal, amorphous material or metal material, an intermediate layer with crystallinity formed on said substrate, and a ferroelectric thin film formed on said intermediate layer, wherein:

(a) the average of thermal expansion coefficients of said substrate from room temperature and a film formation temperature of said ferroelectric thin film is $70 \times 10^{-7}/°C$. or more, (b) the misfit between a lattice constant of said intermediate layer and a lattice constant of said ferroelectric thin film at the aforesaid film formation temperature is within 15%, and (c) at least 75% of crystal axes of said ferroelectric thin film are oriented in the <001>-direction.

8. A ferroelectric thin film device as in claim 7, wherein said ferroelectric thin film mainly includes a ferroelectric material selected from the group consisting of lead titanate system, lead zirconate system or barium titanate system.

9. A ferroelectric thin film device as in claim 7, wherein said ferroelectric thin film has a tetragonal-system crystal structure.

10. A ferroelectric thin film device as in claim 7, wherein said intermediate layer is composed of an oxide having an NaCl crystal structure.

11. A ferroelectric thin film device as in claim 10, wherein said oxide is a (100)-oriented oxide.

12. A ferroelectric thin film device as in claim 10, wherein said oxide is either NiO, CoO, or MgO.

13. A ferroelectric thin film device comprising a substrate consisting of amorphous material, an intermediate layer with crystallinity formed on said substrate, and a ferroelectric thin film formed on said intermediate layer, wherein:

(a) the average of thermal expansion coefficients of said substrate from room temperature to a film formation temperature of said ferroelectric thin film is $50 \times 10^{-7}/°C$. or less, (b) the misfit between a lattice constant of said intermediate layer and a lattice constant of said ferroelectric thin film at the aforesaid film formation temperature is within 15%, and (c) at least 75% of crystal axes of said ferroelectric thin film are oriented in the <100>-direction.

14. A ferroelectric thin film device as in claim 13, wherein said ferroelectric thin film mainly includes a ferroelectric material selected from the group consisting of lead titanate system, lead zirconate titanate system or barium titanate system.

15. A ferroelectric thin film device as in claim 13, wherein said ferroelectric thin film has a tetragonal-system crystal structure.

16. A ferroelectric thin film device as in claim 13, wherein said intermediate layer is composed of an oxide having an NaCl crystal structure.

17. A ferroelectric thin film device as in claim 16, wherein said oxide orients in the (100)-plane.

18. A ferroelectric thin film device as in claim 16, wherein said oxide is either NiO, CoO, or MgO.

19. A method of fabricating a ferroelectric thin film device comprising:

(a) a first step of forming on a substrate consisting of polycrystal, amorphous material or metal material an intermediate layer composed of a (100)-oriented oxide having an NaCl crystal structure, and (b) a second step of forming on said intermediate layer a tetragonal-system, perovskite-type ferroelectric thin film, wherein:

(i) in said first step the average of thermal expansion coefficients of said substrate from room temperature to a film formation temperature of said ferroelectric thin film is $70 \times 10^{-7}/°C$. or more, and (ii) said second step further includes a step of orienting at least 75% of crystal axes of said ferroelectric thin film in the <001>-direction.

20. A ferroelectric thin film device fabricating method as in claim 19, wherein both said first step and said second step are carried out by means of a sputtering technique.

21. A ferroelectric thin film device fabricating method as in claim 19, wherein said first step is carried out by means of a MOCVD (metal-organic chemical vapor deposition) technique using organometallic complex vapors as a source gas, whereas said second step is carried out by means of a sputtering technique.

22. A ferroelectric thin film device fabricating method as in claim 19, wherein said first step is carried out by means of a sputtering technique, whereas said second step is carried out by means of a MOCVD technique using organometallic complex vapors as a source gas.

23. A ferroelectric thin film device fabricating method as in claim 19, wherein both said first step and said second step are carried out by means of a MOCVD technique using organometallic complex vapors as a source gas.

24. A method of fabricating a ferroelectric thin film device comprising:

(a) a first step of forming on a substrate consisting of amorphous material an intermediate layer composed of a (100)-oriented oxide having an NaCl crystal structure, and (b) a second step of forming on said intermediate layer a tetragonal-system, perovskite-type ferroelectric thin film, wherein:

(i) in said first step the average of thermal expansion coefficients of said substrate from room temperature to a film formation temperature of said ferroelectric thin film is $50 \times 10^{-7}/°C$. or less, and (ii) said second step further includes a step of orienting at least 75% of crystal axes of said ferroelectric thin film in the <100>-direction.

25. A ferroelectric thin film device fabricating method as in claim 24, wherein both said first step and said second step are carried out by means of a sputtering technique.

26. A ferroelectric thin film device fabricating method as in claim 24, wherein said first step is carried out by means of a MOCVD technique using organometallic complex vapors as a source gas, whereas said second step is carried out by means of a sputtering technique.

27. A ferroelectric thin film device fabricating method as in claim 24, wherein said first step is carried out by means of a sputtering technique, whereas said second step is carried out by means of a MOCVD technique using organometallic complex vapors as a source gas.

28. A ferroelectric thin film device fabricating method as in claim 24, wherein both said first step and said second step are carried out by means of a MOCVD technique using organometallic complex vapors as a source gas.

* * * * *

UNITED STATES PATENT AND TRADEMARK OFFICE
CERTIFICATE OF CORRECTION

PATENT NO. : 5,866,238
DATED : February 2, 1999
INVENTOR(S) : Takayama et al.

It is certified that error appears in the above-identified patent and that said Letters Patent is hereby corrected as shown below:

On the cover page, Item [73],

Under "Assignee", delete "Minolta Co., Ltd." and insert --Matsushita Electric Industrial Co., Ltd.--

Claim 1, Column 10, line 26, delete "ate" and insert --are--.

Signed and Sealed this

Fifteenth Day of June, 1999

Attest:

Q. TODD DICKINSON

*Attesting Officer*   *Acting Commissioner of Patents and Trademarks*